United States Patent [19]
Yamagishi et al.

[11] Patent Number: 5,771,158
[45] Date of Patent: Jun. 23, 1998

[54] PRINTED CIRCUIT BOARD, PRINTED CIRCUIT BOARD USED FOR FLAT PANEL DISPLAY DRIVE CIRCUIT, AND FLAT PANEL DISPLAY DEVICE

[75] Inventors: Keitarou Yamagishi; Akio Gotoh; Akihiro Miura; Eiji Mukai, all of Tokyo; Eishi Gofuku, Kumamoto, all of Japan

[73] Assignee: Mitsubishi Denki Kabushiki Kaisha, Tokyo, Japan

[21] Appl. No.: 673,797

[22] Filed: Jun. 27, 1996

[30] Foreign Application Priority Data

Sep. 21, 1995 [JP] Japan .................................. 7-243002

[51] Int. Cl.$^6$ .................................................. H05K 7/02
[52] U.S. Cl. ........................ 361/777; 174/261; 349/152; 361/749; 361/794

[58] Field of Search ................................ 174/254, 261, 174/268, 117 F, 117 A; 257/676, 692, 700, 735, 734, 918; 349/149, 150, 151, 152; 361/748, 749, 760, 772, 774, 775, 777, 779, 783, 784, 789, 790, 803, 794, 780, 792; 439/67, 77, 66, 91, 493, 591, 86

[56] References Cited

U.S. PATENT DOCUMENTS 4,655,551 4/1987 Washizuka et al. ..................... 349/150
4,772,820 9/1988 DiSanto et al. ......................... 361/777

*Primary Examiner*—Donald Sparks
*Attorney, Agent, or Firm*—Wolf, Greenfield & Sacks, P.C.

[57] ABSTRACT

The signal connecting through vias are provided on an edge side of a multilayer printed circuit board along a longitudinal direction thereof, and the signal wiring of the respective layers of the signal wiring layer is inclined with respected to the arrangement of the through vias.

18 Claims, 12 Drawing Sheets

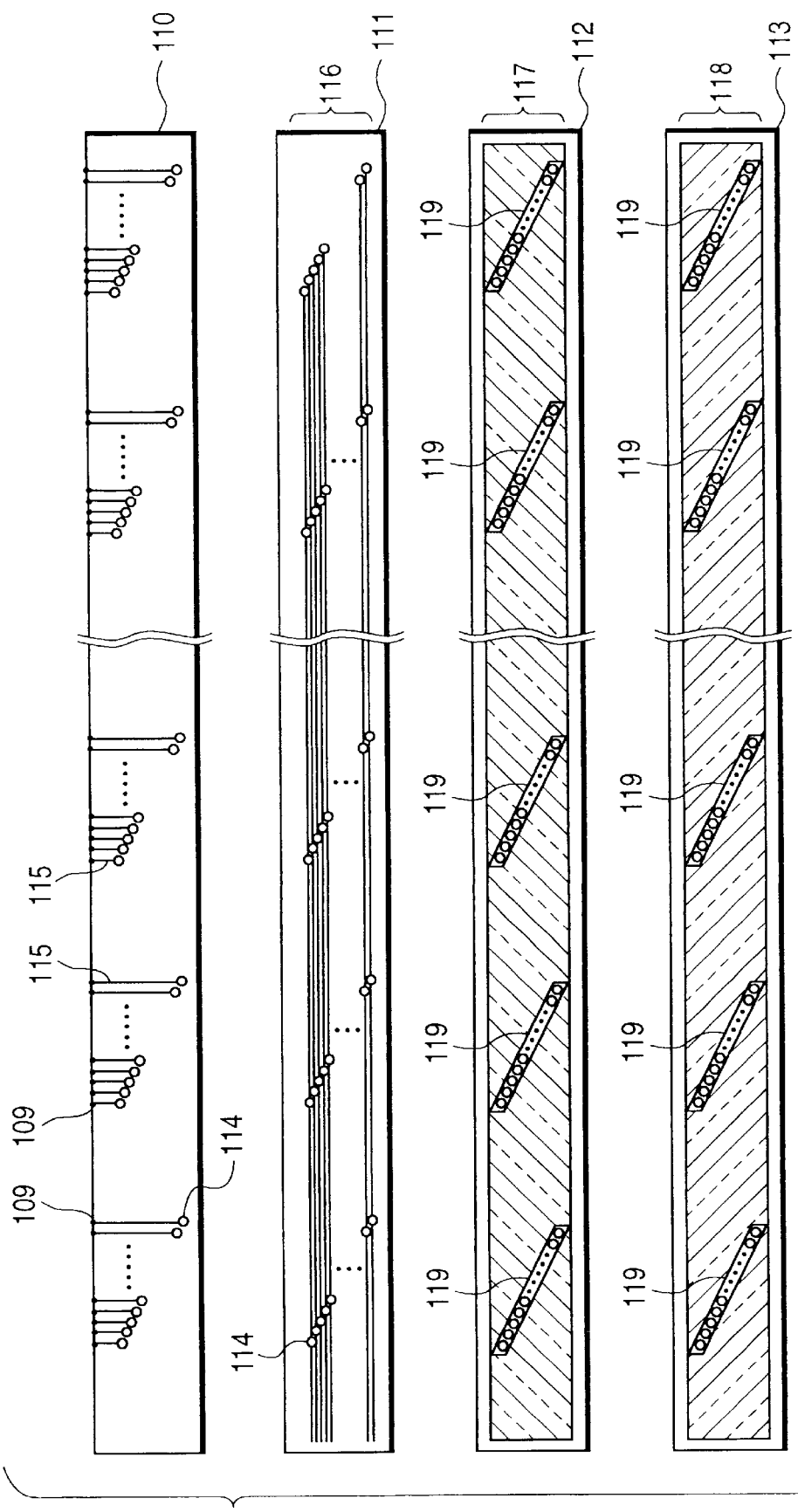

5,771,158

PRINTED CIRCUIT BOARD, PRINTED CIRCUIT BOARD USED FOR FLAT PANEL DISPLAY DRIVE CIRCUIT, AND FLAT PANEL DISPLAY DEVICE

BACKGROUND OF THE INVENTION

The present invention relates to a printed circuit board used in an electronic apparatus, and more specifically, to a printed circuit board for a drive circuit of a flat panel display device such as a liquid crystal display device and a plasma display device, and also to a flat panel display device using this printed circuit board for the flat panel display drive circuit.

FIG. 10 illustrates one example of a connection relationship about input/output signals in a printed circuit board for liquid crystal drive circuit used in a liquid crystal display device constituting the conventional typical flat panel display device. In this drawing, reference numeral 101 shows a display data signal group (will be referred to as a "receive signal group" hereinafter) received by the printed circuit board for liquid crystal display device, reference numeral 102 denotes a circuit for representing a logical connection made on the printed circuit board for liquid crystal drive, and reference numeral 103 denotes a display data signal group (will be referred to as a "transmit signal group" hereinafter) through which a liquid crystal driving IC (will be explained later) mounted on the printed circuit board for liquid crystal drive circuit transmits to a liquid crystal display unit (not shown). Also, reference numeral 104 (namely, $104_1$ to $104_n$) indicates a liquid crystal driving IC, and reference numeral 105 (namely, $105_1$ to $105_n$) shows n pieces of IC pin numerals (first pin number to m-th pin number) of the liquid crystal driving IC 104 ($104_1$ to $104_n$). A plurality (n pieces) of same ICs 104 are mounted on the printed circuit board for liquid crystal drive circuit, and the signals from the receive signal group $10_1$ electrically connect the pins having the same numbers of all of the ICs 104 in parallel.

FIG. 11 illustrates one example of physical shapes of the liquid crystal driving IC mounted on the printed circuit board for liquid crystal drive circuit, of the liquid crystal display unit, and of the printed circuit board for liquid crystal drive circuit. In this drawing, reference numeral 104 shows the liquid crystal driving ICs which are numbered as $104_1$ to $104_n$, assuming that the IC located at the leftmost side of this drawing, corresponds to a first IC, and other ICs correspond to second IC, third IC, - - - , n-th IC. Reference numeral 106 shows a liquid crystal display unit, reference numeral 107 denotes a printed circuit board for liquid crystal drive circuit on which the receive signal group 101 and the connection circuit 102 are printed, reference numeral 108 denotes a TCP (tape carrier package) on which the IC 104 is mounted, and reference numeral 109 shows pads, which are printed on a surface layer to solder the leads of the ICs on a printed circuit board and of which width is larger than those of wirings, used to connect the TCP 108. The printed circuit board for liquid crystal drive circuit 107 is made in an extremely rectangular shape, on which n pieces of ICs $104_1$ to $104_n$ are arranged along one column.

A signal flow operation will now be explained based upon FIG. 10 and FIG. 11. The receive signal group 101 corresponds to display data either directly, or indirectly sent from the system unit to the printed circuit board for liquid crystal drive circuit 107, which is arranged by a unidirectional bus. A connection relationship (101 and 102) shown in FIG. 10 is electrically and physically realized on the printed circuit board for liquid crystal drive circuit 107. The receive signal group 101 received by the printed circuit board for liquid crystal drive circuit 107 is sent out via the IC 104 ($104_1$ to $104_n$) to the liquid crystal unit 106 as the transmit signal group 103. This transmit signal group 103 is electrically and physically realized inside the liquid crystal display unit 106. The IC 104 is mounted on the TCP 108. One side of this TCP 108 is electrically and physically connected via the respective pads 109 to the printed circuit board for liquid crystal drive circuit, whereas the opposite side of this TCP 108 is electrically and physically connected via the respective pads 109 to the liquid crystal display unit 106.

FIG. 12 is a sectional structural view for showing the printed circuit board for liquid crystal drive circuit 107. This printed circuit board for liquid crystal drive circuit 107 is constructed of four layers. In this drawing, reference numeral 110 is a surface wiring layer (also will be referred to as a "surface layer" hereinafter), reference numeral 111 denotes a wiring layer at an inner layer (also, simply referred to as an "inner layer" hereinafter), reference numeral 112 shows a power source layer, reference numeral 113 denotes a ground layer, and reference numeral 114 represents a through via, which is a plated through hole to connect signal wirings on the different layers and is provided along a perpendicular direction with respect to a printed circuit board, used to connect a signal appearing on the surface layer 110 with a signal appearing on the wiring layer 111 of the inner layer.

FIG. 13 is a plan view for showing the respective layers of the conventional printed-circuit for liquid crystal drive circuit 107 having such a layer structure as shown in FIG. 12. In this drawing, reference numeral 115 shows a conducting line used to connect the pads 109 with the through vias 114, reference numeral 116 shows signal wiring fabricated on the inner layer 111, reference numeral 117 indicates a power source plane on the power source layer 112, reference numeral 118 denotes a ground plane on the ground layer 113, and reference numeral 119 represents a hole formed in the power source plane 117 and the ground plane 118 by arranging a plurality of through vias 114.

A signal flow operation will now be made with reference to FIG. 11, FIG. 12 and FIG. 13. The receive signal group 101 is electrically propagated via the signal wiring 116, the through vias 114, the conducting line 115, the pads 109, and the TCP 108 to the leads of the ICs $104_1$ to $104_n$.

It should be noted that the power source and the ground are supplied from the respective power source plane 117 and ground plane 118 via the through vias 114 to the power source pins and ground pins of the respective ICs 104.

Alternatively, a two-layer printed circuit board from which the power supply layer 112 and the ground layer 113 shown in FIG. 12 and FIG. 13 have been omitted may be employed, and the power source and the ground may be supplied by way of a wide line similar to the signal wiring 116, not by the plane.

The above-described conventional printed circuit board for liquid crystal drive circuit owns the below-mentioned problems. That is, firstly, in the case of such a two-layer structured printed circuit board without employing the power source layer 112 and the group layer 113, since neither the power source plane nor the ground plane is present in upper and lower layers of the signal wiring 116, the characteristic impedance of the signal wiring 116 cannot be defined. Furthermore, since the power source and the ground are supplied by way of the lines, the potentials at the power source and the ground supplied to the IC 104 become unstable.

Even when both the power source layer 112 and the ground layer 113 are employed so as to constitute the 4-layer structured printed circuit board, since the printed circuit board for liquid crystal drive circuit 107 is realized by a very narrow multilayer printed circuit board, the shape of the signal wiring 116 becomes an extremely long parallel line as shown in FIG. 13. As a result, the through vias 114 are continuously made along the oblique direction. The holes 119 which intersect the power source plane 117 and the ground plane 118, corresponding to the rectangular planes, are formed whose number is equal to that of the IC mounted on the printed circuit board. Thus, these rectangular planes are not a continuous plane. Accordingly, there are such problems that the potential difference would be partially produced, the potentials at the power source and the ground would be fluctuated, and the power cannot be sufficiently supplied.

Furthermore, since the planes which are not continuous are formed with respect to the direction of the signal wiring 116, the characteristic impedance of the signal wiring 116 becomes discontinued. There are such problems that reflections are produced in the propagated waveforms due to mismatching of the characteristic impedance, and also the noise radiated from the signal wiring cannot be suppressed and therefore would be externally leaked.

Although there are the above-explained electric drawbacks in the conventional printed circuit board for liquid crystal drive circuit, there is a small adverse influence given to the actual display function, since the display operation speeds are slow and the amount of data required for representations is small. However, when the high precision liquid crystal display is realized, the number of pixels should be increased. In connection therewith, the signal operation speed would be increased, and a total number of signal lines which may constitute the radiation noise source would be increased. Therefore, the above-described electric demerits would give adverse influences to the display screen, it is difficult to correctly display the content of the data on the display screen, and also the electromagnetic waves which causes a risk that the external electric appliance would be erroneously operated are radiated.

SUMMARY OF THE INVENTION

The present invention has been made to solve the above-explained problems, and therefore, has an object to provide such a printed circuit board, a printed circuit board for flat panel display drive circuit used in a flat panel display device, and a flat panel display device, which are operable not under electrically erroneous operating condition even when a large amount of data is handled at high speed.

According to a first aspect of the invention is, a printed circuit board comprising:

a multilayer having an elongate shape;

first through vias connected to leads of ICs either directly or indirectly mounted on the printed circuit board, being formed in one edge portion of the printed circuit board in such a manner that the respective first through vias constitute either a single column or plural columns along a direction parallel to the longitudinal direction of the printed circuit board;

second through vias for connecting signal wirings of a first layer with signal wirings of a second layer which constitute a signal layer of the printed circuit board, being formed in the other end portion of the printed circuit board in such a manner that the respective second through vias constitute either a single column or plural columns along a direction parallel to the longitudinal direction of the printed circuit board, the first through vias and the second through vias being arranged at positions shifted from the line perpendicular to the longitudinal direction of the printed circuit board; and a signal wiring between the first through vias and the second through vias in the first layer and in the second layer being arranged with having an angle with respect to the line perpendicular to the longitudinal direction of the printed circuit board so as to connect the same number leads of the ICs with each other.

According to a second aspect of the invention is, the printed circuit board of the first aspect, further comprising:

pads for connecting the ICs to the first layer by being connected to the first through vias is fabricated between the first through vias and the edge portion of the printed circuit board along the longitudinal direction, the first layer being used as a surface layer of the printed circuit board.

According to a third aspect of the invention is, the printed circuit board of the second aspect, wherein the surface layer comprises the pads, the first through vias, and the second through vias, and a signal wiring on the surface layer is fabricated on an additional wiring layer.

According to a fourth aspect of the invention is, the printed circuit board of the second aspect, wherein the pads are fabricated in the signal wiring of the first layer.

According to a fifth aspect of the invention is, a printed circuit board comprising:

a multilayer having an elongate shape, first through vias connected to leads of ICs either directly or indirectly mounted on the printed circuit board are formed at a central portion of the printed circuit board in such a manner that the respective the first through vias constitute either a single column or plural columns along a direction parallel to the longitudinal direction of the printed circuit board; and the same number leads of the ICs are connected with each other only by one wiring layer.

According to a sixth aspect of the invention is, the printed circuit board of the fifth aspect, further comprising:

a surface layer including pads for being connected with the first through vias, and the through vias;

a signal wiring layer for signal wiring for connecting the same number leads of the ICs with each other;

a power source layer; and a ground layer.

According to a seventh aspect of the invention is, the printed circuit board of the fifth aspect, wherein the signal wiring of the signal wiring layer is divided so as to be wired on plural layers including layers added for signal wiring.

According to an eighth aspect of the invention is, the printed circuit board of the sixth aspect, wherein the signal wiring of the signal wiring layer is divided so as to be wired on plural layers including layers added for signal wiring.

According to a ninth aspect of the invention is, the printed circuit board of the sixth aspect, further comprising:

a power source plane and a ground plane are fabricated on each side of the first through vias, so that the power source plane and the ground plane constitute a single power supply layer.

According to a tenth aspect of the invention is, the printed circuit board of the seventh aspect, further comprising:

a power source plane and a ground plane are fabricated on each side of the first through vias, so that the power source plane and the ground plane constitute a single power supply layer.

According to an eleventh aspect of the invention is, the printed circuit board of the eighth aspect, further comprising:

a power source plane and a ground plane are fabricated on each side of the first through vias, so that the power source plane and the ground plane constitute a single power supply layer.

According to a twelfth aspect of the invention is, a printed circuit board comprising:

a multilayer having an elongate shape, pads connected to leads of ICs either directly or indirectly mounted on the printed circuit board, which are formed at a central portion of the printed circuit board, along the direction parallel to the longitudinal direction of the printed circuit board, respectively for each ICs, in either a single column or plural columns; and the same number leads of the ICs are connected with each other by way of only a surface layer.

According to a thirteenth aspect of the invention is, a printed circuit board for a flat panel display drive circuit comprising:

the printed circuit board of the first aspect.

According to a fourteenth aspect of the invention is, a printed circuit board for a flat panel display drive circuit comprising:

the printed circuit board of the fifth aspect.

According to a fifteenth aspect of the invention is, a printed circuit board for a flat panel display drive circuit comprising:

the printed circuit board of the twelfth aspect.

According to a sixteenth aspect of the invention is, a flat panel display device comprising:

the printed circuit board for a flat panel display drive circuit of the thirteenth aspect.

According to a seventeenth aspect of the invention is, a flat panel display device comprising:

the printed circuit board for a flat panel display drive circuit of the fourteenth aspect.

According to an eighteenth aspect of the invention is, a flat panel display device comprising:

the printed circuit board for a flat panel display drive circuit of the fifteenth aspect.

BRIEF DESCRIPTION OF THE DRAWINGS

FIG. 13 is the plan views for representing the respective layers of the conventional printed circuit board for liquid crystal drive circuit.

DETAILED DESCRIPTION OF THE PREFERRED EMBODIMENTS (Embodiment 1)

Figure 1:
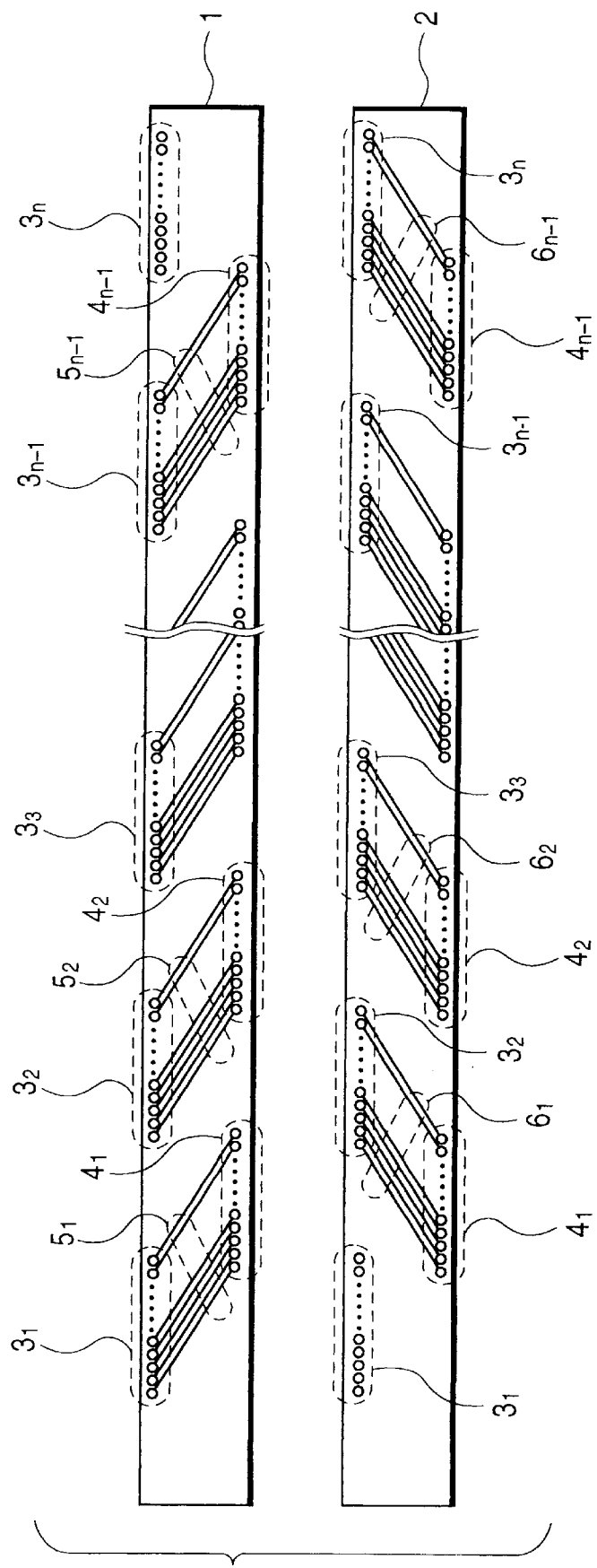
FIG. 1 shows a structure of an embodiment mode 1 of a printed circuit board according to the present invention.

FIG. 1 represents an embodiment mode of a printed circuit board according to the present invention. In this drawing, reference numeral 1 indicates a first wiring layer (first layer), reference numeral 2 shows a second wiring layer (second layer), reference numeral $3_1$ is a through vias group connected to the respective pins (also referred to as "leads", not shown) of a first IC, reference numeral $3_2$ denotes a through vias group connected to the respective pins (not shown) of a second IC, - - - , and reference numeral $3_n$ denotes a through vias group connected to the respective pins (not shown) of the last n-th IC. Reference numeral $4_1$ shows a wiring folding through vias group between the first IC and the second IC, reference numeral $4_2$ indicates a wiring folding through vias group between the second IC and the third IC, - - - , and reference numeral $4_{n-1}$ is a wiring holding through vias group between the (n-1)th IC and the n-th IC. Reference numeral $5_1$ shows a wiring group along a first inclined direction between the first IC and the second IC, reference numeral $5_2$ shows a wiring group along a first inclined direction between the second IC and the third IC, - - - , and reference numeral $5_{n-1}$ shows a wiring group along a first inclined direction between the (n-1)th IC and the n-th IC, and the wiring groups 5 ($5_1$ to $5_{n-1}$) along the first inclined direction are formed on a first wiring layer 1. Reference numeral $6_1$ indicates a wiring group along a second inclined direction between the first IC and the second IC, reference numeral $6_2$ shows a wiring group along the first inclined direction between the second IC and the third IC, - - - , and reference numeral $6_{n-1}$ indicates a wiring group along the second inclined direction between the (n-1)th IC and the n-th IC, and also the wiring groups 6 ($6_1$ to $6_{n-1}$) along the second inclined direction are formed on a second wiring layer 2. The through vias groups 3 ($3_1$ to $3_{n-1}$) are arranged along one long side, and the wiring folding through vias groups 4 ($4_1$ to $4_{n-1}$) are arranged along an opposite long side.

For the sake of an easy explanation, an IC arranged at the leftmost side of this drawing is recognized as the first IC, and the subsequent ICs are recognized as the second IC, - - - , the n-th IC. This may be similarly applied to embodiment modes (will be discussed later).

Referring now to the drawing, a description will be made of a signal connection relationship according to this embodiment. The wiring group $5_1$ along the first inclined direction between the first IC and the second IC is provided from the through vias group $3_1$ connected to the respective leads of the first IC within the first wiring layer 1. Subsequently, the wiring group $5_1$ along the first inclined direction is connected to the wiring folding through vias group $4_1$ between the first IC and the second IC, and furthermore is connected to the wiring group $6_1$ along the second inclined direction between the first IC and the second IC, provided with the second wiring layer 2. Subsequently, this wiring group $6_1$ along the second inclined direction between the first IC and the second IC is connected to the through vias group $3_2$ connected to the respective leads of the second IC. This signal connecting method is carried out in this order of $3_1$-$5_1$-$4_1$-$6_1$-$3_2$-$5_2$-$4_2$-$6_2$-$3_3$, - - -, $3_{n-1}$-$5_{n-1}$-$4_{n-1}$-$6_{n-1}$-$3_n$ from the first IC up to the last n-th IC, and namely constitutes the wiring by a so-called "one-stroke-writing" method with employment of the two wiring layers.

As described above, according to the mode 1 of this embodiment, since the signal wiring is realized by way of a so-called "one-stroke-writing" method, such a printed circuit board having the better electric characteristic and substantially no reflections caused by the branch can be obtained.

In the case that the printed circuit board according to the mode of this embodiment is applied a multilayer printed circuit board with using a power source layer and a ground layer, since all of the signal through vias ($3_1$ to $3_n$ and $4_1$ to $4_{n-1}$) can be arranged at the edge portion of this multilayer printed circuit board, there is no such a conventional hole 119 which intersects such planes produced inside the power source plane of the power source layer and the ground plane of the ground layer. Also, since all of the signal wiring groups are arranged along the inclined direction, the impedance is not increased. To the contrary, the impedance is conventionally increased when there are the signal wiring groups located in parallel to either the edge of the power source plane or the edge of the ground plane.

As a consequence, when the mode of this embodiment is applied to a liquid crystal driving printed circuit board, it is possible to obtain such a printed circuit board having a very good electric characteristic.

It should be noted that although all of the through vias are provided at the edge portion of the long side of the printed circuit board in the above-described mode of the embodiment, these through vias may be partially arranged in a similar manner to that of the conventional printed circuit board.

Also, the through vias are arranged in one column in the above-described mode of the embodiment, but may be alternatively arranged in plural columns.

Also, the shape of the printed circuit board is made rectangular in the above-explained mode of the embodiment, but may be alternatively made pentagular or hexagonal, namely a rectangular shape without corners. Otherwise, the shape of the printed circuit board may be made of such a rectangular shape whose long side is omitted.

The above-described modification may be applied not only to this embodiment, but also to the subsequent embodiments.

(Embodiment 2)

Figure 2:
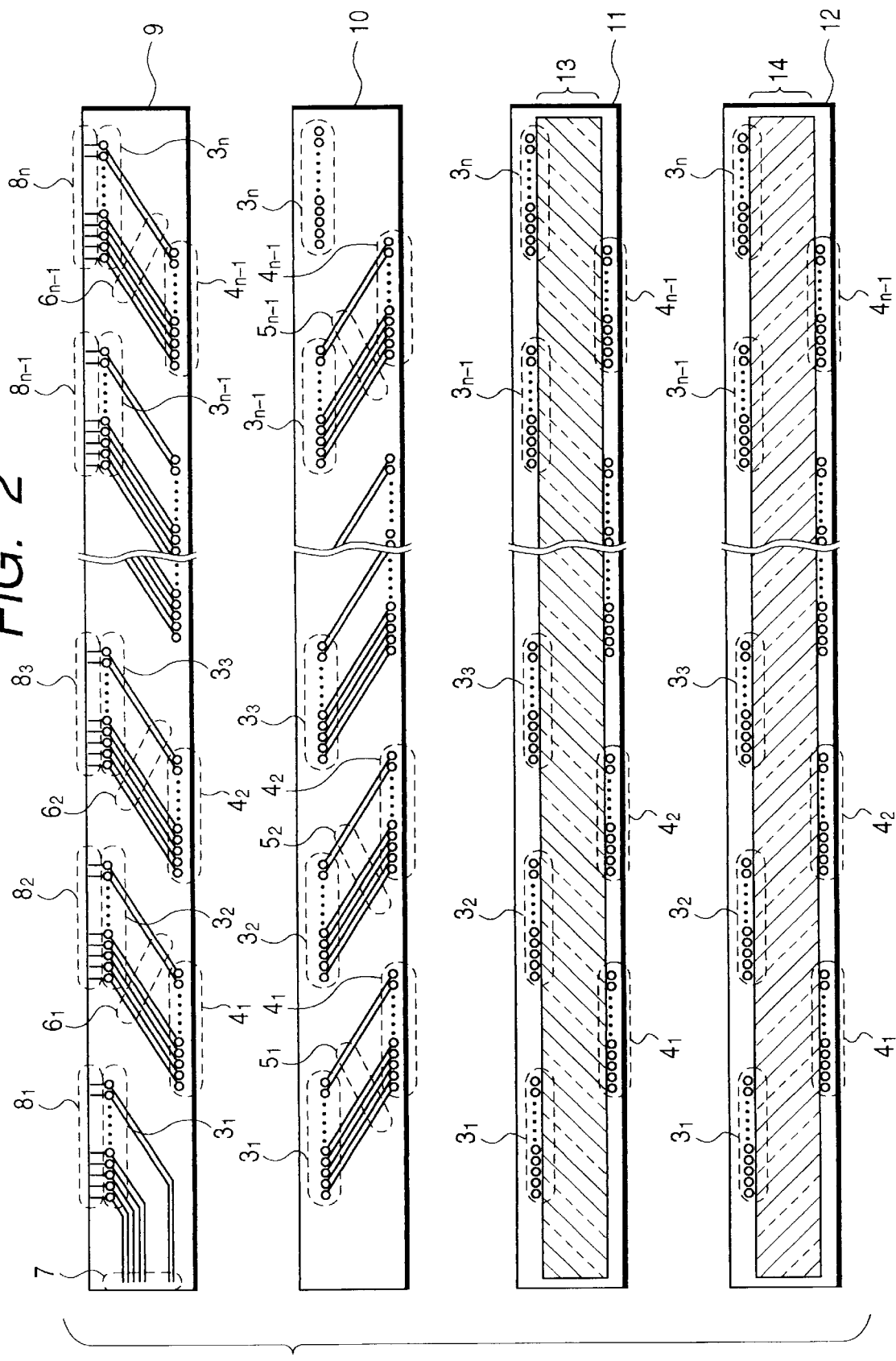
FIG. 2 shows a structure of an embodiment mode 2 of a printed circuit board according to the present invention.

FIG. 2 illustrates another embodiment mode of the printed circuit board according to the present invention. The mode of this embodiment corresponds to such an example that the conceptual idea of the present invention as explained in the mode 1 is applied to a four-layer printed circuit board. In this drawing, reference numeral 7 shows a wiring group for a display data signal (will be referred to as a "receive signal wiring group" hereinafter) which is sent out from a system side for a display purpose. This receive signal wiring group is logically identical to the receive signal group 101. The receive signal group 101 is physically realized as the receive signal wiring group 7. Reference numeral 8 ($8_1$ to $8_n$) shows pads groups used to be connected with a TCP (not shown) mounted on an IC. Reference numeral 9 denotes a surface wiring layer, reference numeral 10 indicates an inner wiring layer, reference numeral 11 represents a power source layer, reference numeral 12 is a ground layer, reference numeral 13 indicates a power source plane formed on the power source layer 11, and reference numeral 14 denotes a ground plane formed on the ground layer 12. It should be understood that the through vias groups 3, 4 and the wiring groups 5, 6 along the first and second inclined directions are the same as those of the embodiment mode 1.

A larger structure of a printed circuit board according to this embodiment mode is the same as that of the prior art, namely the four-layer printed circuit board.

As the surface wiring layer 9, the second wiring layer 2 shown in FIG. 1 is used, whereas the second wiring layer 1 in FIG. 1 is used as the inner wiring layer 10. The wiring groups $6_1$ to $6_{n-1}$ along the second inclined direction indicated in FIG. 1 are arranged on the surface layer 9, and the wiring groups $5_1$ to $5_{n-1}$ along the first inclined direction shown in FIG. 1 are arranged on the inner surface layer 10. Reference numerals 11 and 12 are a power source layer and a ground layer, respectively.

Furthermore, in the surface layer, the wiring 7 for the display data signal 101 transferred from the system, and also the pads 8 ($8_1$ to $8_n$) used to be connected with the IC are also stored.

It should be noted that a surface layer implies a layer on which a component (TCP for connecting IC) is mounted, and other layers are an inner layer in the specification.

As previously explained, the same effects as those of the embodiment mode 1 may be achieved in the printed circuit board according to this embodiment mode 1. That is to say, since all of the signal through vias ($3_1$ to $3_n$ and $4_1$ to $4_{n-1}$) can be arranged at the edge portion of this multilayer printed circuit board, there is no such a conventional hole 119 (see FIG. 13) which intersects such planes produced inside the power source plane of the power source layer and the ground plane of the ground layer. Also, since all of the signal wiring groups are arranged along the inclined direction, the impedance is not increased. To the contrary, the impedance is conventionally increased when there are the signal wiring groups located in parallel to either the edge of the power source plane or the edge of the ground plane.

(Embodiment 3)

Figure 3:
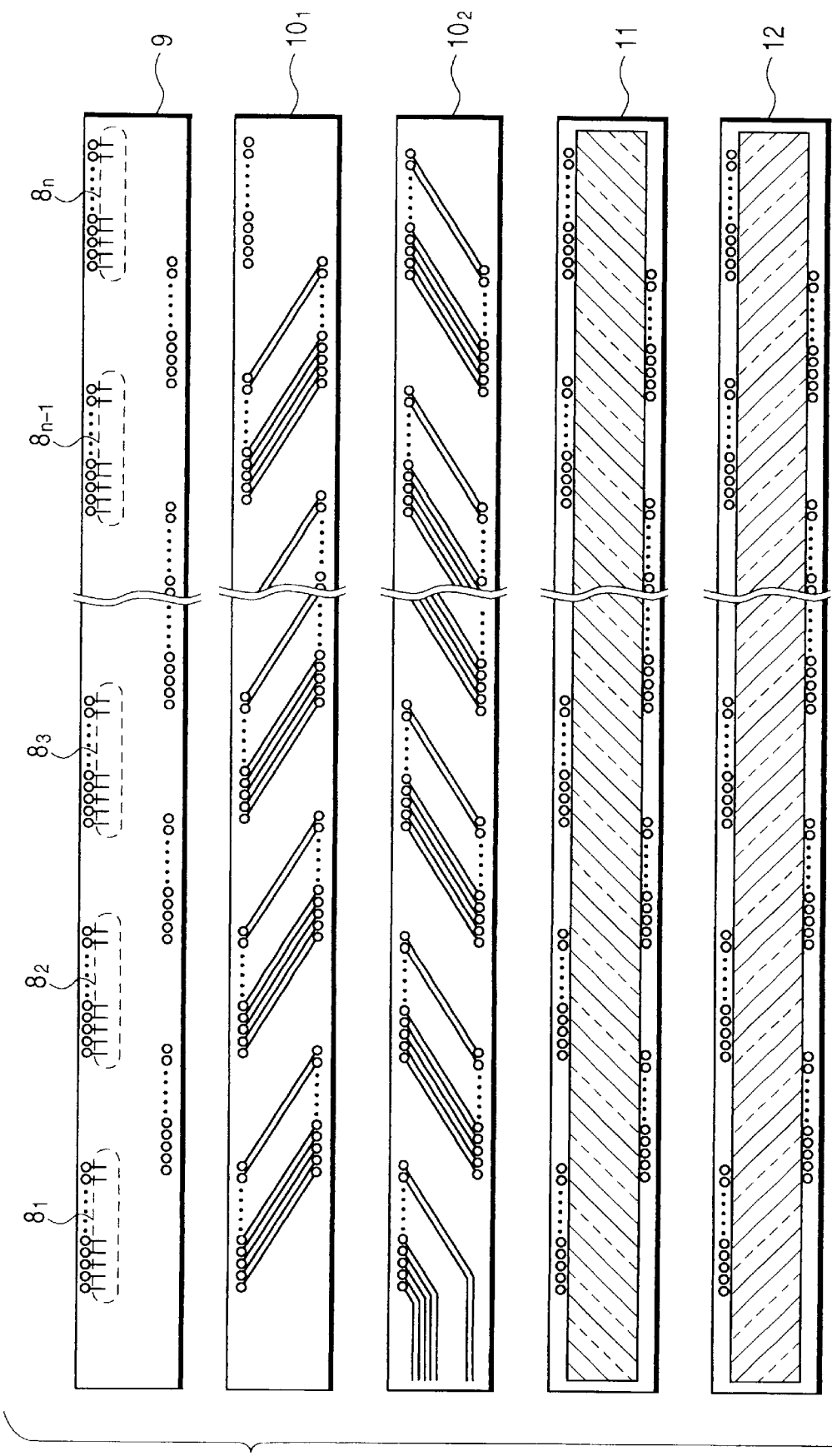
FIG. 3 shows a structure of an embodiment mode 3 of a printed circuit board according to the present invention.

FIG. 3 represents a further embodiment mode of the printed circuit board according to the present invention. In this drawing, reference numeral 9 shows a surface layer on which pads groups 8 ($8_1$ to $8_n$) and through vias exists. Pads are used to be connected with TCPs, and through vias are used to connect signals between the successive layers. Reference numeral $10_1$ is the first inner wiring layer which corresponds to the first wiring layer 1 of FIG. 1, and reference numeral $10_2$ is the second inner wiring layer which corresponds to the second wiring layer of FIG. 1.

Although the surface layer 9 is employed as one of the wiring layers in the mode 2 of the embodiment, the mode 3 of this embodiment owns such a structure that the surface layer is separated from the wiring layer. As a result, it is possible to establish such a structure that both the first wiring layer and the second wiring layer are vertically sandwiched by the power source plane and the ground plane by changing the sequence of the stacked layers. Thus, it is possible to realize such a structure capable of further resisting the electromagnetic radiation.

Also, in accordance with the mode of this embodiment, the width of the printed circuit board can be made small only by the length of the pads 8, as compared with the mode 2 of the embodiment.

As a result, the mode of this embodiment may be extremely suitable to such a printed circuit board for a liquid crystal drive circuit, which requires that the width of the printed circuit board should be made narrow.

(Embodiment 4)

Figure 4:
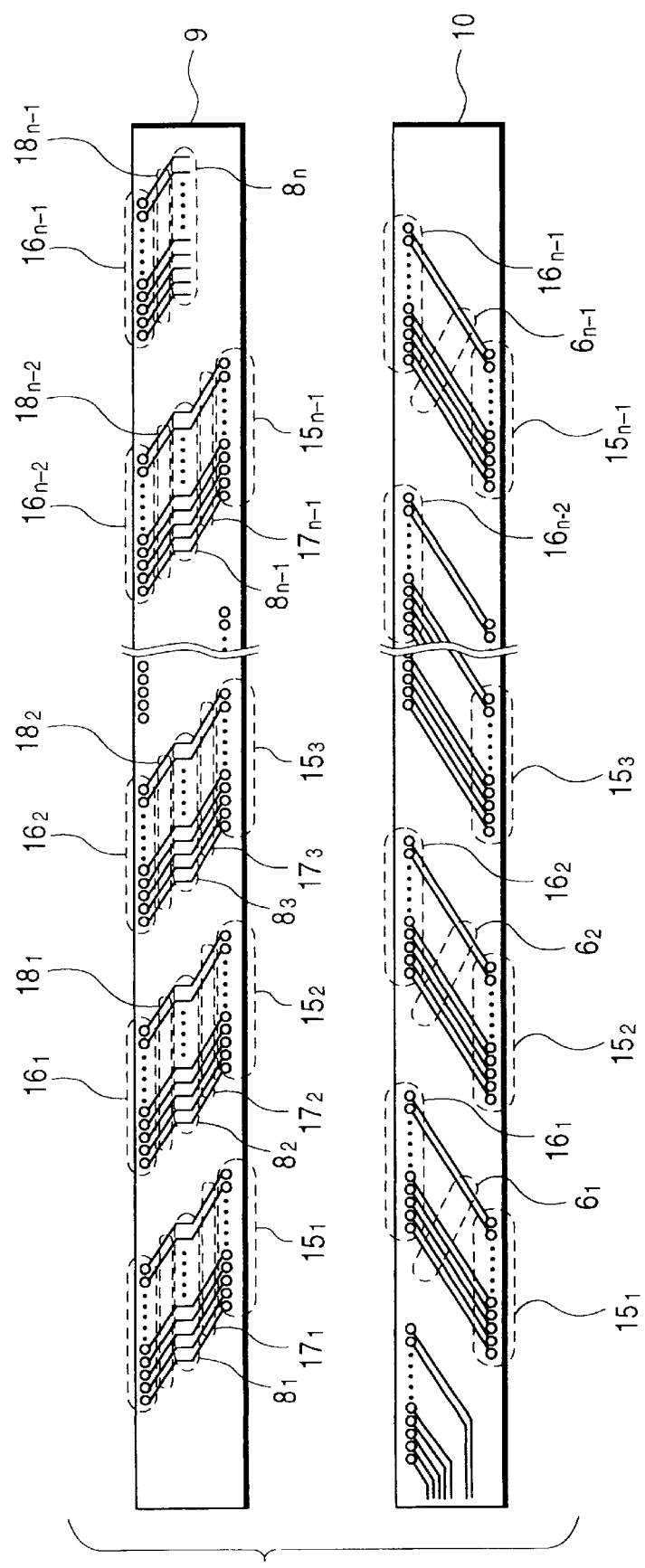
FIG. 4 shows a structure of an embodiment mode 4 of a printed circuit board according to the present invention.

FIG. 4 shows a further embodiment mode of the printed circuit board according to the present invention. In this drawing, reference numeral $8_1$ indicates pads groups for a first IC, reference numeral $8_2$ shows pads group for a second IC, - - -, reference numeral $8_n$ denotes pads group for a final n-th IC. Also, reference numeral $15_1$ shows a first wiring folding vias group between the first IC and the second IC, reference numeral $15_2$ represents a first wiring folding vias group between the second IC and the third IC, - - -, reference numeral $15_{n-1}$ denotes a first wiring folding vias group between the (n−1)th IC and the final n-th IC, and also reference numeral $16_1$ shows a second wiring folding vias group between the first IC and the second IC, reference numeral $16_2$ represents a second wiring folding vias group between the second IC and the third IC, - - -, reference numeral $16_{n-1}$ denotes a second wiring folding vias group between the (n−1)th IC and the final n-th IC, and also reference numeral $17_1$ represents a wiring group in a (1−1)th inclined direction, come out from the pads group $8_1$ of the first IC so as to direct to the second IC, reference numeral $17_2$ denotes a wiring group in a (1−1)th inclined direction, come out from the pads group $8_2$ of the second IC so as to direct to the third IC, - - -, reference numeral $17_{n-1}$ shows a wiring group in the (1−1)th inclined direction, come out from the pads group $8_{n-1}$ of (n−1)th IC in order to direct the n-th IC, and further reference numeral $18_1$ indicates a wiring group in a (1−2)th inclined direction, entered into the pads group $8_2$ of the second IC, reference numeral $18_2$ shows a wiring group in the (1−2)th inclined direction, entered into the pads group $8_3$ of the third IC, - - -, reference numeral $18_{n-1}$ shows a wiring group in the (1−2)th inclined direction, entered into the pads group $8_n$ of the n-th IC. Reference numeral 6 ($6_1$ to $6_{n-1}$) corresponds to the wiring group in the second inclined direction, fabricated on the wiring layer 10 of the inner layer according to the embodiment mode 1.

Referring now to the drawing, a signal connection relationship of the printed circuit board according to the mode of this embodiment will be described. The surface layer 9 is used as a first wiring layer, and there are the pads groups $8_1$ to $8_n$ to be connected with the leads of the respective ICs in the same layer. The wiring group $17_1$ in the (1−1)th inclined direction is come out from the pads group $8_1$ of the first IC, and is connected to the first wiring folding vias group $15_1$ between the first IC and the second IC. Next, this first wiring folding vias group $15_1$ is advanced to the second wiring layer 10 from which the wiring group $6_1$ in the second inclined direction is come, and this wiring group $6_1$ is connected to the second wiring folding vias group $16_1$ between the first IC and the second IC. Next, the second wiring folding vias group $16_1$ is advanced again to the first wiring layer 9 from which the wiring group $18_1$ in the (1−2)th inclined direction is come and, this wiring group $18_1$ is connected to the pads group $8_2$ of the second IC. This connection method is carried out from the first IC to the last n-th IC in this order of $8_1$-$17_1$-$15_1$-$6_1$-$16_1$-$18_1$-$8_2$-$17_2$-$15_2$-$6_2$-$16_2$-$18_2$-$8_3$, - - -, $8_{n-1}$-$17_{n-1}$-$15_{n-1}$-$6_{n-1}$-$16_{n-1}$-$18_{n-1}$-$8_n$.

As previously described, in accordance with the mode 4 of this embodiment, since the pads and the first wiring layer are provided on the same layer, the surface layer is necessarily used as the first wiring layer 9 similar to the mode 2 of the embodiment. In the mode 4 of this embodiment, since the pads groups 8 are formed at the central portion of the printed circuit board, the width of the printed circuit board can be made narrow only by the length of the pads 8 without decreasing the widths of the power source plane 13 and of the ground plane 14.

Also, since the total number of layers of the printed circuit board can be reduced by 1, the thickness of the printed circuit board can be made thin.

As a consequence, the mode of this embodiment is extremely suitable for a printed circuit board for a liquid crystal drive circuit which requires that a width of this printed circuit board is made narrow and also a thickness thereof is made thin.

(Embodiment 5)

Figure 5:
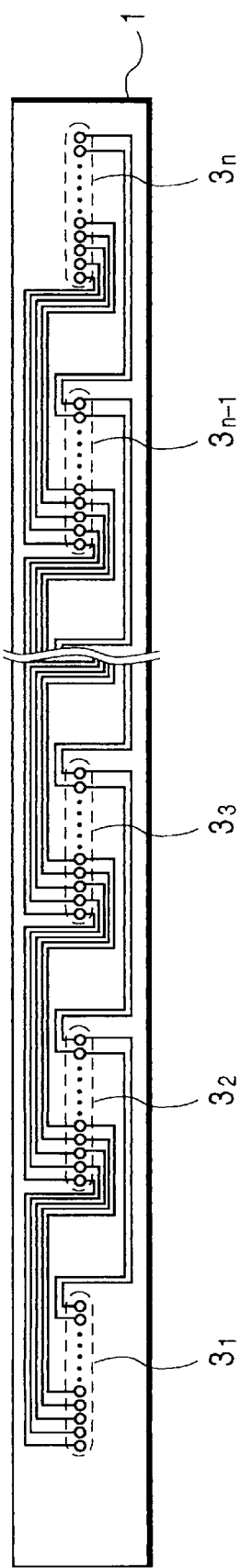
FIG. 5 shows a structure of an embodiment mode 5 of a printed circuit board according to the present invention.

FIG. 5 indicates a further embodiment mode of the printed circuit board according to the present invention. In this drawing, reference numeral 1 is a wiring layer, and reference numeral 3 ($3_1$ to $3_n$) shows through vias groups.

Referring now to the drawing, the mode of this embodiment will be explained. In this embodiment mode, only one wiring layer 1 is employed. The respective through vias groups 3 ($3_1$ to $3_n$) to be connected to pads (not shown) of the first IC to the last n-th IC are arranged near a central portion of a printed circuit board in an equiinterval in parallel to a long side of this printed circuit board. The wiring is made from the through vias group $3_1$ connectable with the respective leads of the first IC along an upper direction, as viewed in this drawing, and thereafter bent along a right direction (as viewed in this drawing). Subsequently, the wiring is bent along a lower direction (as viewed in this drawing), thereafter is bent along a right direction (as viewed in this drawing), and finally is bent along the upper direction (as viewed in this drawing), and then is made up to the through vias group $3_2$ connectable to the respective leads of the second IC. This wiring method is repeatedly performed until the wiring is connected to the through vias group $3_n$ connectable with the respective leads of the n-th IC.

It should be understood that the wiring is not always made only along these vertical and horizontal directions, but also is made with employment of either inclined wiring or curved wiring.

As previously explained, in accordance with the mode of this embodiment, since the through vias can be concentrated to the central portion of the printed circuit board, such a through vias column which intersects the printed circuit board in the prior art is no longer present. As a consequence, when the mode of this embodiment is applied to a multilayer printed circuit board such as a printed circuit board for liquid crystal drive circuit, it is possible to provide a printed circuit board with an excellent electric characteristic.

(Embodiment 6)

Figure 6:
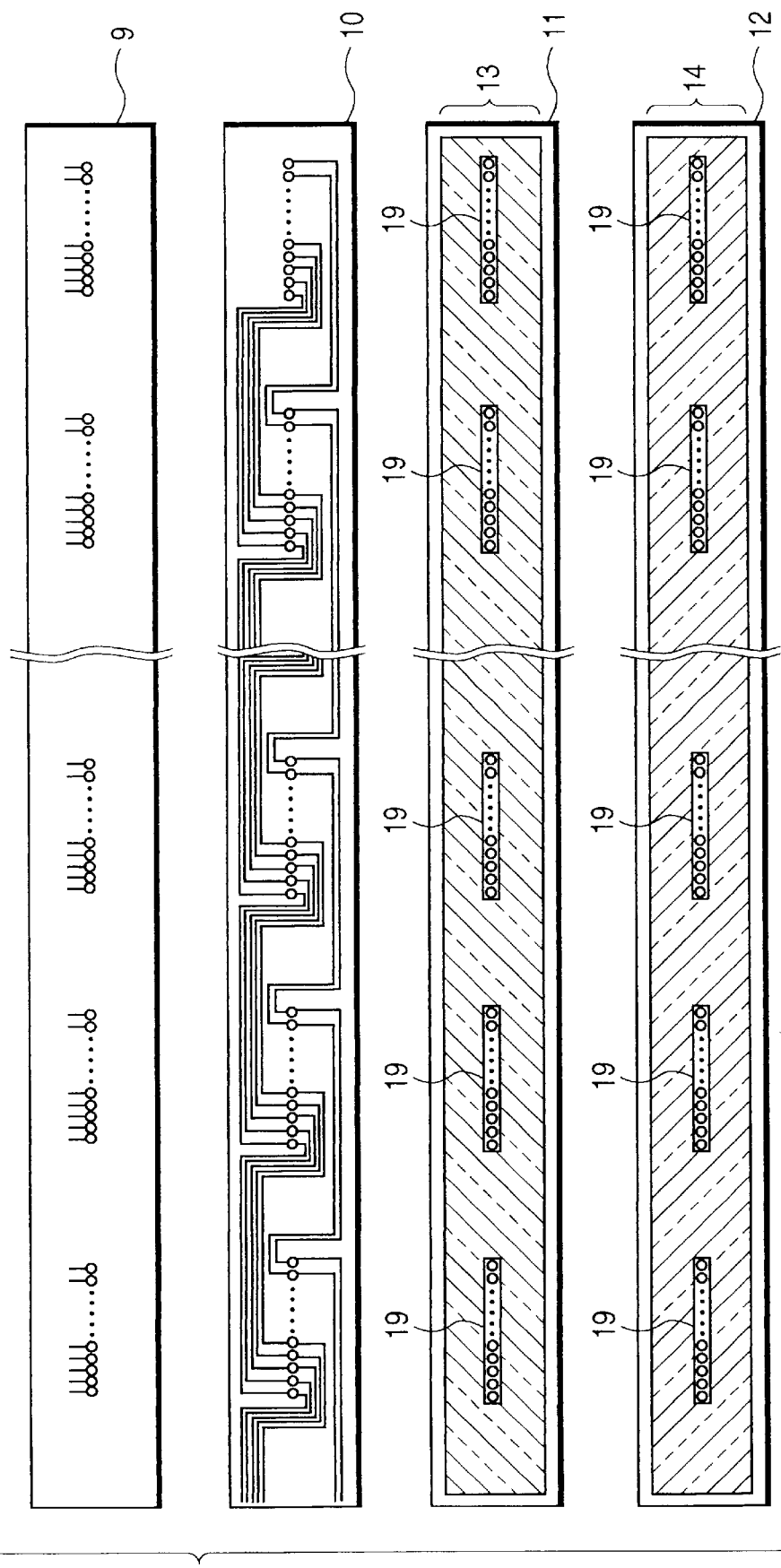
FIG. 6 shows a structure of an embodiment mode 6 of a printed circuit board according to the present invention.

FIG. 6 illustrates a still further embodiment mode of the printed circuit board according to the present invention. The mode 6 of this embodiment corresponds to one application such that the mode 5 of the embodiment is applied to a multilayer printed circuit board. In this drawing, reference numeral 9 shows a surface layer, on which through vias groups and pads groups are formed. Reference numeral 10 denotes an inner wiring layer, reference numeral 11 denotes a power source layer, reference numeral 12 represents a ground layer, reference numeral 13 shows a power source plane, reference numeral 14 indicates a ground plane, and reference numeral 19 is a hole formed by the through vias groups.

A layer structure of this embodiment mode is the same as that of the embodiment mode 2 shown in FIG. 2, namely corresponds to a four-layer printed circuit board. In accordance with this embodiment mode, all of the signal through vias can be concentrated near a central portion of the printed circuit board and can be located at a long side thereof in parallel to each other. As a consequence, in the prior art shown in FIG. 13, there are the holes 119 along the inclined direction, which intersect the power source plane 117 of the power source layer 112, and the ground plane 118 of the ground layer 113. To the contrary, in accordance with the mode of this embodiment, the holes 19 which intersect the power source plane 13 of the power source layer 11, and the ground plane of the ground layer 12 are arranged at a central portion of the printed circuit board along one column in parallel to each other in long-side direction of this printed circuit board. Accordingly, the printed circuit board owns such a shape which never deteriorates a firm characteristic of power supplying. Alternatively, the wiring layer 10 of the inner layer may be sandwiched between the power source plane and the ground plane by changing the sequence of the stacked layers, so that the resultant printed circuit board can have the structure capable of resisting the electromagnetic radiation.

As a consequence, since this embodiment mode is employed, it is possible to realize a printed circuit board for liquid crystal drive circuit, having an excellent electric characteristic.

(Embodiment 7)

Figure 7:
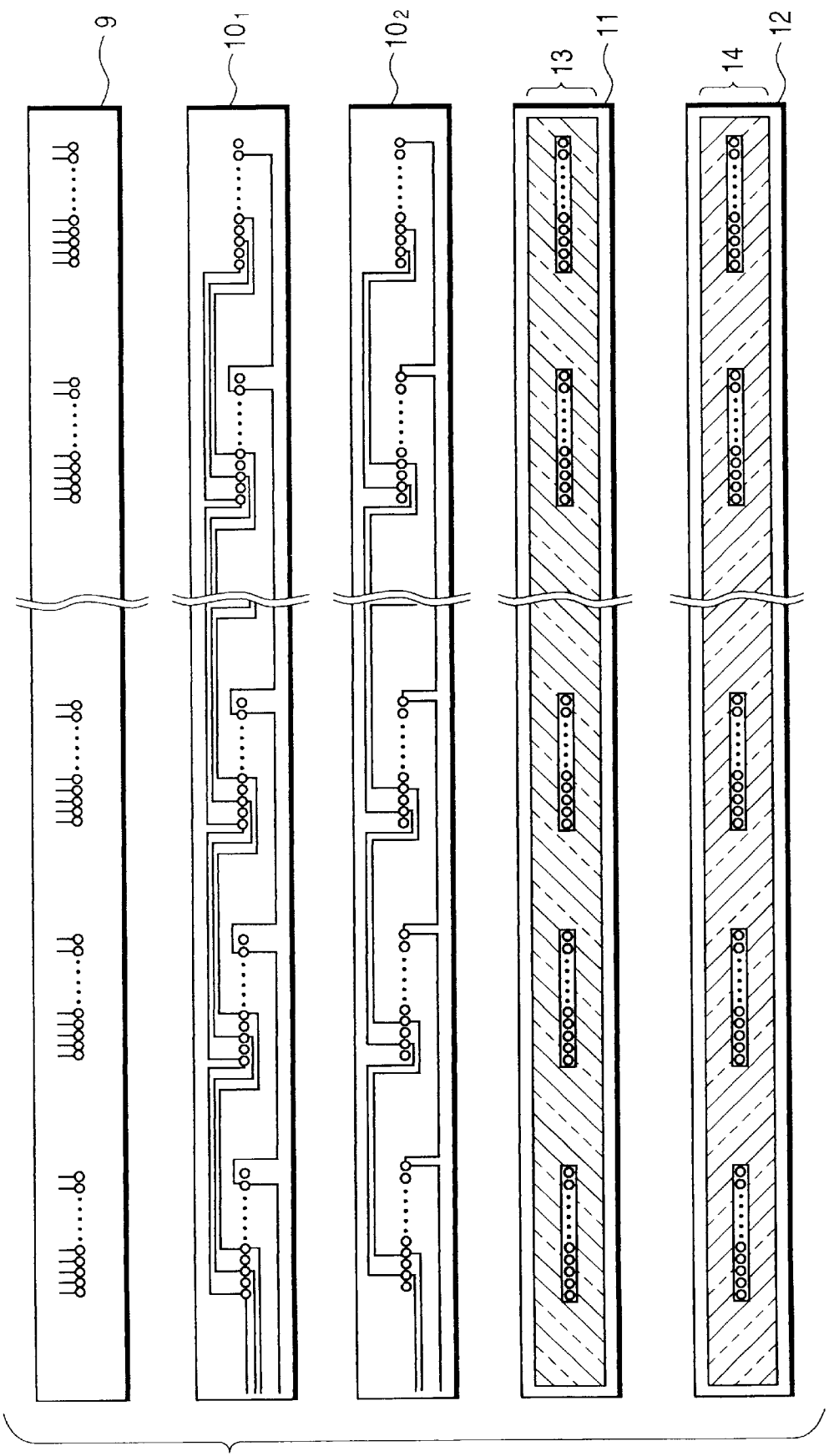
FIG. 7 shows a structure of an embodiment mode 7 of a printed circuit board according to the present invention.

FIG. 7 represents another embodiment mode of the printed circuit board according to the present invention. In this embodiment mode, one signal wiring layer is added with respect to the mode 6 of the embodiment, and the signal wiring is subdivided into two signal wiring systems. The pads for mounting the respective ICs are provided on the surface layer 9, and the through vias connectable with these pads are arranged near a central portion of the printed circuit board and in parallel to a long side thereof. In a first inner wiring layer $10_1$, the wiring similar to that (see FIG. 5) of the mode 5 of the embodiment is made every two through vias connected to the pads of the respective ICs. With respect to the through vias in the first inner wiring layer $10_1$ where no wiring is carried out, the wiring similar to that (see FIG. 5) of the mode 5 of the embodiment is similarly made in a second inner wiring layer $10_2$.

As a result, according to this embodiment mode, similar to the mode 6 of the embodiment, the first inner wiring layer $10_1$ and the second inner wiring layer $10_2$ are sandwiched between the power source layer 11 and the ground layer 12 by changing the sequence of the stacked layer, so that it is possible to realize such a structure capable of resisting the electromagnetic radiation. Furthermore, according to the mode of this embodiment, since the total signal number per one wiring layer becomes a half of that in the mode 6 of the embodiment, the width of the signal wiring area in the printed circuit board for liquid crystal drive circuit to which the mode of this embodiment is applied can be reduced by half at maximum. Accordingly, the width of the printed circuit board can be made narrow.

Also, the number of wiring layers is further increased, so that the signal line number per one layer can be further decreased, and the width of the printed circuit board can be further made narrow.

(Embodiment 8)

Figure 8:
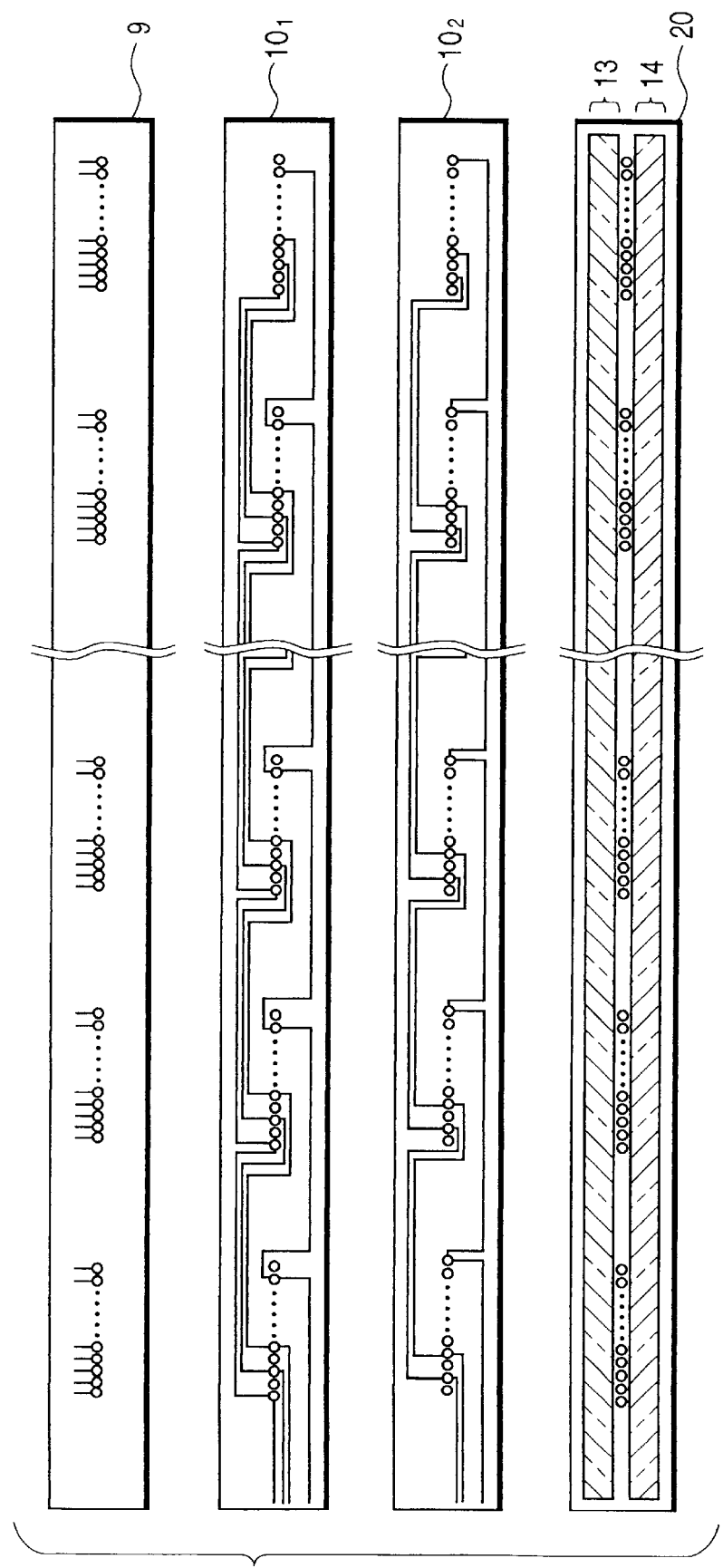
FIG. 8 shows a structure of an embodiment mode 8 of a printed circuit board according to the present invention.

FIG. 8 indicates a further embodiment mode of the printed circuit board according to the present invention. Reference numeral 20 is a power supply layer containing both the power source plane 13 and the ground plane 14. In accordance with the mode of this embodiment, the power source layer 11 and the ground layer 12 employed in the mode 7 of the embodiment are constructed as a single layer.

Referring now to the drawing, the mode of this embodiment will be described. A surface layer 9, a first inner wiring layer $10_1$, and a second inner wiring layer $10_2$ are completely the same as those of the embodiment mode 7 shown in FIG. 7. The power supply layer 20 is such a layer that two planes are employed in a single layer by connecting the holes 19 formed in the through vias in the plane of the power supply layer 11 (otherwise ground layer 12) employed in the embodiment mode 7 shown in FIG. 7 from the left edge to the right edge, as viewed in the drawing.

As previously explained, according to the embodiment of this embodiment, since both the power source plane 13 and the ground plane 14 can be constructed into a single layer, the total layer number of multilayer printed circuit board can be reduced by 1, as compared with that of the embodiment mode 7. When this embodiment mode is applied to the printed circuit board for liquid crystal drive circuit, it is possible to provide such a low-cost printed circuit board for liquid crystal drive circuit.

(Embodiment 9)

Figure 9:
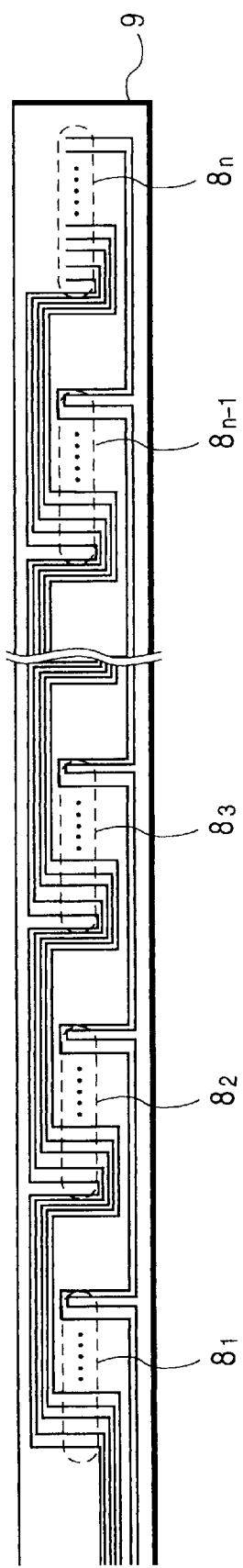
FIG. 9 shows a structure of an embodiment mode 9 of a printed circuit board according to the present invention.
Figure 10:
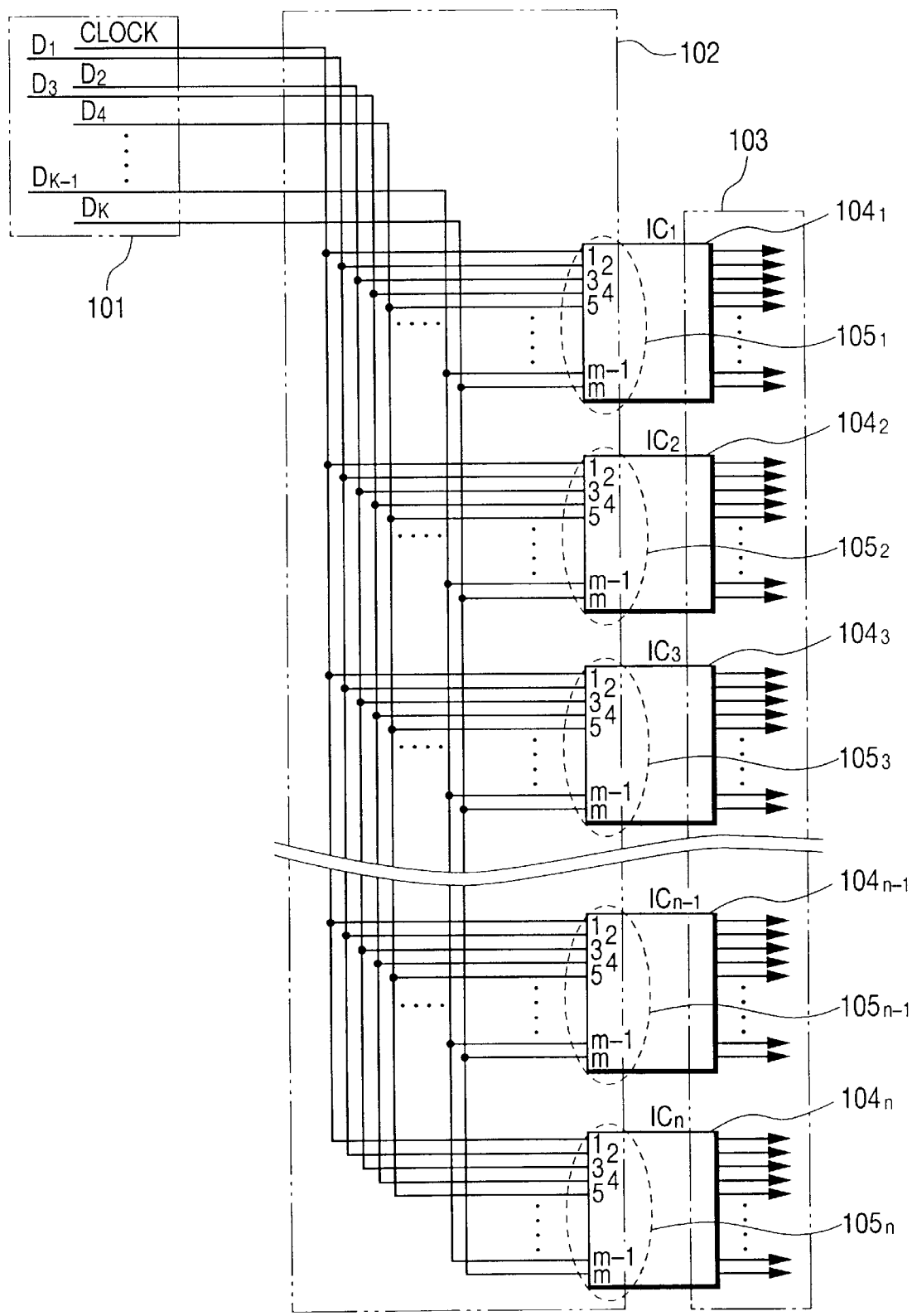
FIG. 10 indicates the connection relationship of the conventional printed circuit board for liquid crystal drive circuit.
Figure 11:
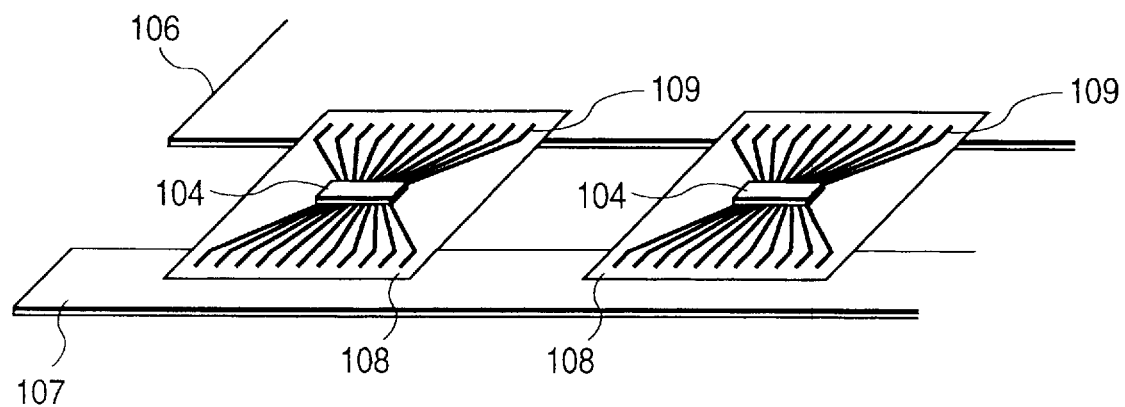
FIG. 11 represents the physical shapes of the printed circuit board for liquid crystal drive circuit, and of the liquid crystal display unit of the liquid crystal display device.
Figure 12:
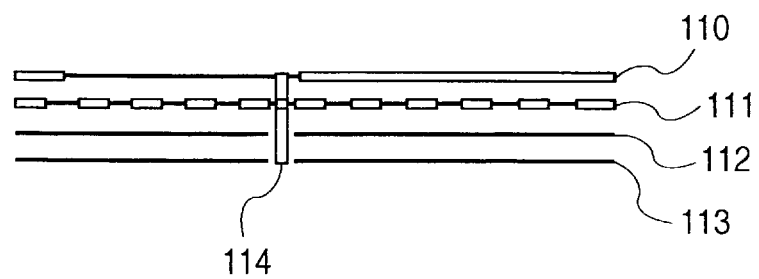
FIG. 12 is the sectional view for indicating the conventional printed circuit board for liquid crystal drive circuit.

FIG. 9 illustrates a still further embodiment mode of the printed circuit board according to the present invention. The mode of this embodiment is realized by combining the technical idea of the embodiment mode 4 shown in FIG. 4 with the technical idea of the embodiment mode 5 shown in FIG. 5. In this drawing, reference numeral 8 ($8_1$ to $8_n$) indicates pads groups provided at a central portion of the printed circuit board, and reference numeral 9 shows a surface layer.

With reference to the drawing, the mode of this embodiment will now be explained. The pads groups $8_1$ to $8_n$ for mounting thereon the respective ICs (from first IC to n-th IC) are provided near a central portion of the surface layer 9 of the printed circuit board. A wiring method among the respective pads groups 8 (between $8_1$ and $8_2$, between $8_2$ and $8_3$, - - - , between $8_{n-1}$ and $8_n$) is identical to that among the respective through vias 3 (between $3_1$ and $3_2$, between $3_2$ and $3_3$, - - - , between $3_{n-1}$ and $3_n$) in FIG. 5.

According to the mode of this embodiment, since the wiring layer for the signal can be realized by a single layer, when the mode of this embodiment is applied to such a multilayer printed circuit board containing a power source layer and a ground layer, the role of the surface layer 9 and the inner wiring layer 10 shown in FIG. 6 can be filled by way of only one layer, as compared with the mode 6 of the embodiment indicated in FIG. 6. Thus, a total layer number can be reduced. Furthermore, no longer the signal through vias groups 3 ($3_1$ to $3_n$) for connecting the surface layer 9 with the inner wiring layer 10 shown in FIG. 6 is required. There are only the holes of the power source plane 13 and the ground plane 14 for the power supply purpose. Accordingly, the power supply functions can be further emphasized.

Moreover, when the mode 8 of the embodiment where the power source plane and the ground plane are provided in a single power supply layer is applied to the embodiment of this embodiment, since no longer the width of the hole 19 by the through vias groups 3 is required, the widths of the respective planes can be widened.

While the printed circuit boards have been exemplified in the above-described embodiments, the printed circuit boards explained in the embodiment modes may be readily applied to such a printed circuit board for a drive circuit of a flat panel display device, e.g., a liquid crystal display device and a plasma display device.

As previously explained, according to the present invention, in the elongated multilayer printed circuit board, the signal connecting through vias are provided on the edge side of the above-described printed circuit board along the longitudinal direction and arranged in parallel to the longitudinal direction, and also the connections among the respective through vias are made at the angle with respect to the longitudinal direction of the printed circuit board. Accordingly, it is possible to obtain the printed circuit board having the better electric characteristic.

Since the layer structure of the multilayer printed circuit board is increased in order that no signal wiring is formed on the surface layer, the width of the printed circuit board can be made narrow by the length of the pads used to connect the IC.

Also, since the pads for connecting the IC are provided at the central portion of the printed circuit board, the width of the printed circuit board can be made narrow without reducing the widths of the power source plane and of the ground plane.

Also, as the signal connecting through vias are provided at the central portion of the printed circuit board and arranged in parallel to the longitudinal direction of the printed circuit board, neither the power source plane or ground plane is not discontinuous, and the printed circuit board with the better electric characteristic can be obtained.

Since the signal connecting through vias are provided at the central portion of the printed circuit board and arranged in parallel to the longitudinal direction of the printed circuit board, and also no signal connecting wiring is provided on the surface layer, and furthermore the number of signal lines is subdivided into the two wiring layers, the width of the printed circuit board can be reduced by the width equal to a half of area where the signal line is occupied.

Also, since the signal connecting through vias are provided at the central portion of the printed-circuit and arranged in parallel to the longitudinal direction of the printed circuit board, and also the power supply layer on where the power source plane and the ground plane are fabricated is provided, the total layer number of the printed circuit board can be reduced.

Also, as the IC connecting pads are provided at the central portion of the printed circuit board, and also the signal wiring is made only by this surface layer, the signal connecting through vias are no longer required. The total layer number can be reduced and the power supply function can be emphasized.

When the above-explained printed circuit board is applied to the printed circuit board for the drive circuit of the flat panel display device such as the liquid crystal display, the problems about the conventional printed circuit board for the flat panel display drive circuit can be solved. That is to say, the power source and the ground become uniform planes to realize the sufficiently emphasized power supply, it is possible to realize such a high-precision flat panel display device capable of highly resisting the electromagnetic radiation, and also capable of easily controlling the characteristic impedance of the signal wiring.

What is claimed is:

1. A printed circuit board comprising:
   multilayer having an elongate shape;
   first through vias connected to leads of ICs either directly or indirectly mounted on said printed circuit board, being formed in one edge portion of said printed circuit board in such a manner that said respective first through vias constitute either a single column or plural columns along a direction parallel to the longitudinal direction of said printed circuit board;
   second through vias for connecting signal wirings of a first layer with signal wirings of a second layer which constitute a signal layer of said printed circuit board, being formed in an opposite edge portion of said printed circuit board in such a manner that said respective second through vias constitute either a single column or plural columns along a direction parallel to the longitudinal direction of said printed circuit board,
   said first through vias and said second through vias being arranged at positions shifted from the line perpendicular to the longitudinal direction of said printed circuit board; and
   a signal wiring between said first through vias and said second through vias in said first layer and in said second layer being arranged with having an angle with respect to the line perpendicular to the longitudinal direction of said printed circuit board so as to connect the same number leads of said ICs with each other.

2. The printed circuit board of claim 1, further comprising:
   pads for connecting said ICs to said first layer by being connected to said first through vias is fabricated between said first through vias and the edge portion of said printed circuit board along the longitudinal direction, said first layer being used as a surface layer of said printed circuit board.

3. The printed circuit board of claim 2, wherein
   said surface layer comprises said pads, said first through vias, and said second through vias, and
   a signal wiring on said surface layer is fabricated on an additional wiring layer.

4. The printed circuit board of claim 2, wherein
   said pads are fabricated in said signal wiring of said first layer.

5. A printed circuit board comprising:
   a multilayer having an elongate shape,
   first through vias connected to leads of ICs either directly or indirectly mounted on said printed circuit board are formed at a central portion of said printed circuit board in such a manner that the respective said first through vias constitute either a single column or plural columns along a direction parallel to the longitudinal direction of said printed circuit board; and the same number leads of said ICs are connected with each other only by one wiring layer.

6. The printed circuit board of claim 5, further comprising:
   a surface layer including pads for being connected with said first through vias;
   a signal wiring layer having signal wiring for connecting the same number leads of said ICs with each other;
   at least one power source layer; and
   at least one ground layer.

7. The printed circuit board of claim 5, wherein signal wiring of a signal wiring layer is divided so as to be wired on plural layers including layers added for signal wiring.

8. The printed circuit board of claim 6, wherein said signal wiring of said signal wiring layer is divided so as to be wired on plural layers including layers added for signal wiring.

9. The printed circuit board of claim 6, further comprising:

a power source plane and a ground plane are fabricated on each side of said first through vias, so that said power source plane and said ground plane constitute a single power supply layer.

10. The printed circuit board of claim 7, further comprising:

a power source plane and a ground plane are fabricated on each side of said first through vias, so that said power source plane and said ground plane constitute a single power supply layer.

11. The printed circuit board of claim 8, further comprising:

a power source plane and a ground plane are fabricated on each side of said first through vias, so that said power source plane and said ground plane constitute a single power supply layer.

12. A printed circuit board comprising:

a multilayer having an elongate shape, including a surface layer, at least one power source layer, and at least one ground layer, pads connected to leads of ICs either directly or indirectly mounted on said printed circuit board and having a same pin order, which are formed at a central portion of said printed circuit board, along the direction parallel to the longitudinal direction of said printed circuit board, respectively for each ICs, in either a single column or plural columns; and the same number leads of said ICs are connected with each other by way of only said surface layer.

13. A printed circuit board for a flat panel display drive circuit comprising:

said printed circuit board of claim 1.

14. A printed circuit board for a flat panel display drive circuit comprising:

said printed circuit board of claim 5.

15. A printed circuit board for a flat panel display drive circuit comprising:

said printed circuit board of claim 12.

16. A flat panel display device comprising:

said printed circuit board for a flat panel display drive circuit of claim 13.

17. A flat panel display device comprising:

said printed circuit board for a: flat panel display drive circuit of claim 14.

18. A flat panel display device comprising:

said printed circuit board for a flat panel display drive circuit of claim 15.

* * * * *

UNITED STATES PATENT AND TRADEMARK OFFICE
CERTIFICATE OF CORRECTION

PATENT NO : 5,771,158
DATED : June 23, 1998
INVENTOR(S) : Keitarou YAMAGISHI et al.

It is certified that error appears in the above-identified patent and that said Letters Patent are hereby corrected as shown below:

On the title page, item [73] change the Assignee to:

--Mitsubishi Denki Kabushiki Kaisha, Tokyo, Japan
and
Advanced Display Inc., Kumamoto, Japan--.

Signed and Sealed this

Twenty-first Day of September, 1999

Attest:

Q. TODD DICKINSON

*Attesting Officer*     *Acting Commissioner of Patents and Trademarks*